United States Patent
Kim et al.

(10) Patent No.: US 10,476,023 B2
(45) Date of Patent: Nov. 12, 2019

(54) DISPLAY ELEMENT, ORGANIC LIGHT EMITTING DISPLAY DEVICE AND DATA DRIVER

(71) Applicant: LG DISPLAY CO., LTD., Seoul (KR)

(72) Inventors: Jaesung Kim, Paju-si (KR); MinWoo Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/833,050

(22) Filed: Dec. 6, 2017

(65) Prior Publication Data
US 2018/0182995 A1   Jun. 28, 2018

(30) Foreign Application Priority Data
Dec. 22, 2016 (KR) .................. 10-2016-0177001

(51) Int. Cl.
*H01L 51/52* (2006.01)
*H01L 27/32* (2006.01)
(Continued)

(52) U.S. Cl.
CPC ....... *H01L 51/5206* (2013.01); *G09G 3/3233* (2013.01); *G09G 3/3266* (2013.01);
(Continued)

(58) Field of Classification Search
CPC ............. H01L 51/5206; H01L 51/5221; H01L 27/3265; H01L 27/3262; H01L 27/3276;
(Continued)

(56) References Cited

U.S. PATENT DOCUMENTS 8,358,297 B2 * 1/2013 Tanikame ............ G09G 3/3233
345/211
9,691,325 B2 * 6/2017 Park .................... G09G 3/3233
(Continued)

FOREIGN PATENT DOCUMENTS

JP   2003-150106 A   5/2003
JP   2003-173154 A   6/2003
(Continued)

OTHER PUBLICATIONS

Office Action dated Nov. 15, 2018 from the Japanese Patent Office in related Japanese application No. 2017-236064.

*Primary Examiner* — Grant Sitta
(74) *Attorney, Agent, or Firm* — Morgan, Lewis & Bockius LLP

(57) ABSTRACT

The present disclosure relates to a display element comprising an organic light emitting diode including a first electrode and a second electrode, a driving transistor including a first node to be supplied with a data voltage, a second node connected to the first electrode of the organic light emitting diode, and a third node electrically connected to a driving voltage line, a first transistor electrically connected between a data line configured to supply the data voltage and the first node of the driving transistor, a second transistor electrically connected between an initialization voltage line configured to supply an initialization voltage and the second node of the driving transistor, and a capacitor electrically connected between the first node and the second node of the driving transistor.

14 Claims, 10 Drawing Sheets

(51) Int. Cl.
*G09G 3/3266* (2016.01)
*G09G 3/3233* (2016.01)
*H01L 27/12* (2006.01)
*G09G 3/3291* (2016.01)

(52) U.S. Cl.
CPC ......... *G09G 3/3291* (2013.01); *H01L 27/124* (2013.01); *H01L 27/1255* (2013.01); *H01L 27/3262* (2013.01); *H01L 27/3265* (2013.01); *H01L 51/5221* (2013.01); *G09G 2300/0426* (2013.01); *G09G 2300/0465* (2013.01); *G09G 2300/0861* (2013.01); *G09G 2310/0251* (2013.01); *G09G 2310/0262* (2013.01); *H01L 27/3276* (2013.01)

(58) Field of Classification Search
CPC .. H01L 27/124; G09G 3/3291; G09G 3/3266; G09G 3/3233; G09G 2300/0861; G09G 2310/0262; G09G 2310/0251; G09G 2300/0426; G09G 2300/0465
See application file for complete search history.

(56) References Cited

U.S. PATENT DOCUMENTS

| | | | |
|---|---|---|---|
| 2004/0041750 A1* | 3/2004 | Abe | G09G 3/3233 345/76 |
| 2004/0174349 A1* | 9/2004 | Libsch | G09G 3/3233 345/204 |
| 2005/0017934 A1* | 1/2005 | Chung | G09G 3/3233 345/82 |
| 2011/0025677 A1* | 2/2011 | Park | G09G 3/3258 345/212 |
| 2011/0157125 A1* | 6/2011 | Choi | H05B 33/0896 345/211 |
| 2011/0199357 A1* | 8/2011 | Chung | G09G 3/3233 345/211 |
| 2011/0205220 A1* | 8/2011 | Ota | G09G 3/3233 345/212 |
| 2012/0001893 A1* | 1/2012 | Jeong | G09G 3/3233 345/213 |
| 2012/0139890 A1* | 6/2012 | Choi | G09G 3/3233 345/212 |
| 2013/0002632 A1* | 1/2013 | Choi | G09G 3/325 345/211 |
| 2013/0057532 A1* | 3/2013 | Lee | G09G 3/3225 345/211 |
| 2013/0076771 A1 | 3/2013 | Bachman et al. | |
| 2013/0229405 A1 | 9/2013 | Ono | |
| 2013/0321376 A1* | 12/2013 | Kim | G09G 3/3233 345/212 |
| 2014/0152633 A1 | 6/2014 | Park et al. | |
| 2015/0243220 A1* | 8/2015 | Kim | H01L 27/1225 345/215 |
| 2016/0275869 A1* | 9/2016 | Hwang | G09G 3/3258 |

FOREIGN PATENT DOCUMENTS

| | | |
|---|---|---|
| JP | 2011-107441 A | 6/2011 |
| JP | 2014-109778 A | 6/2014 |
| WO | 2013/076771 A1 | 5/2013 |

\* cited by examiner

DISPLAY ELEMENT, ORGANIC LIGHT EMITTING DISPLAY DEVICE AND DATA DRIVER

CROSS-REFERENCE TO RELATED APPLICATIONS

This application claims priority from Korean Patent Application No. 10-2016-0177001, filed on Dec. 22, 2016, which is hereby incorporated by reference for all purposes as if fully set forth herein.

BACKGROUND

Technical Field

The present disclosure relates to a display element and a display device that displays an image.

Description of the Related Art

An organic light emitting display device which has recently attracted a lot of attention as a display device uses a self-emitting organic light emitting diode (OLED), and thus has the advantages of a high response speed and increased luminous efficiency, brightness and view angle.

In the organic light emitting display device, pixels including an OLED are disposed in a matrix form and the brightness of sub pixels, selected in response to a gate signal, is controlled. Each pixel of the display device includes an OLED and a driving circuit for driving the OLED. The driving circuit for the OLED within each pixel includes a transistor and a storage capacitor.

The driving circuit in each pixel of the display device has increased in size, which causes a low aperture ratio and makes it difficult to perform a high-speed operation. Also, the area of a driver that drives the driving circuit in each pixel of the display device has increased, which makes it difficult to achieve a narrow bezel.

SUMMARY

Accordingly, embodiments of the present disclosure are directed to a display element, organic light emitting display device and data driver that substantially obviate one or more of the problems due to limitations and disadvantages of the related art.

An aspect of the present disclosure is to provide a display element and a display device in which an aperture ratio can be increased and a high-speed operation can be performed.

Another aspect of the present disclosure is to provide a display element and a display device in which the area of a driver can be reduced so as to achieve a narrow bezel.

Additional features and aspects will be set forth in the description that follows, and in part will be apparent from the description, or may be learned by practice of the concepts provided herein. Other features and aspects of the concepts may be realized and attained by the structure particularly pointed out in the written description, or derivable therefrom, and the claims hereof as well as the appended drawings.

To achieve these and other aspects of the inventive concepts, as embodied and broadly described, and according to an aspect of the present disclosure, there is provided a display element including an organic light emitting diode including a first electrode and a second electrode, a driving transistor including a first node to be supplied with a data voltage, a second node connected to the first electrode of the organic light emitting diode, and a third node electrically connected to a driving voltage line, a first transistor electrically connected between a data line configured to supply the data voltage and the first node of the driving transistor, a second transistor electrically connected between an initialization voltage line configured to supply an initialization voltage and the second node of the driving transistor, and a capacitor electrically connected between the first node and the second node of the driving transistor.

According to another aspect of the present disclosure, there is provided a display device including a plurality of pixels at intersections of a plurality of data lines and a plurality of gate lines, a plurality of common gate lines to supply a common gate signal to the plurality of pixels, a common gate link line connected in common to the plurality of common gate lines, a plurality of initialization voltage lines to supply an initialization voltage to the plurality of pixels, and an initialization voltage link line connected in common to the plurality of initialization voltage lines. Each of the plurality of pixels includes an organic light emitting diode including a first electrode and a second electrode, a driving transistor including a first node to be supplied with a data voltage from one of the data lines, a second node connected to the first electrode of the organic light emitting diode, and a third node electrically connected to a driving voltage line, a first transistor electrically connected between the one of the data lines and the first node of the driving transistor and switched by a gate signal supplied through one of the gate lines, a second transistor electrically connected between one of the initialization voltage lines and the second node of the driving transistor and switched by the common gate signal supplied through one of the common gate lines, and a capacitor electrically connected between the first node and the second node of the driving transistor.

According to yet another aspect of the present disclosure, there is provided a data driver including a data unit connected to data lines and configured to supply a data voltage to pixels through the data lines, a common gate signal supply unit connected to a common gate link line and configured to supply a common gate signal to the pixels through the common gate link line, and an initialization voltage supply unit connected to an initialization voltage link line and configured to supply an initialization voltage to the pixels through the initialization voltage link line.

It is to be understood that both the foregoing general description and the following detailed description are example and explanatory and are intended to provide further explanation of the disclosure as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain the various principles. In the drawings.

DETAILED DESCRIPTION

Figure 1:
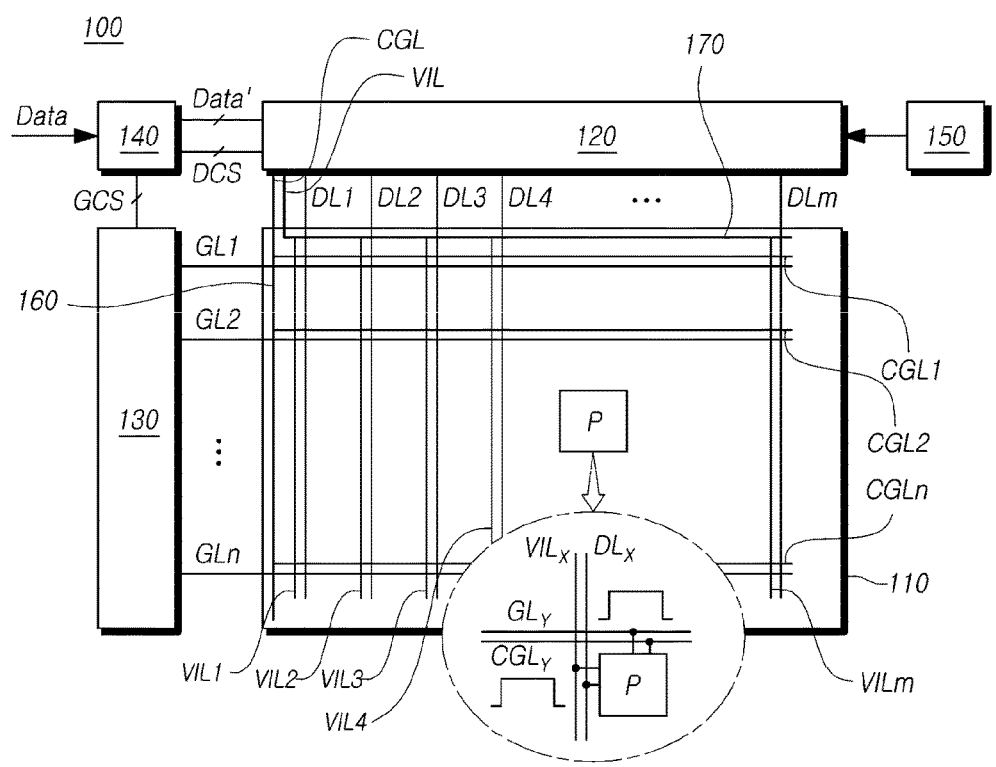
FIG. 1 is a configuration view of a display device according to the present example embodiments.

Hereinafter, some embodiments will be described in detail with reference to the accompanying drawings. When reference numerals refer to components of each drawing, although the same components are illustrated in different drawings, the same components are referred to by the same reference numerals as possible. Further, if it is considered that description of related known configuration or function may cloud the gist of the present disclosure, the description thereof will be omitted.

Further, in describing components of the present disclosure, terms such as first, second, A, B, (a), (b), etc. can be used. These terms are used only to differentiate the components from other components. Therefore, the nature, order, sequence, or number of the corresponding components is not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

FIG. 1 is a configuration view of a display device according to the present example embodiments.

With reference to FIG. 1, a display device 100 according to the present example embodiments includes a display panel 110, a data driver 120, a gate driver 130, a controller 140, etc.

In the display panel 110, a plurality of data lines DL1, DL2, DL3, . . . , DLm is disposed in a first direction, a plurality of gate lines GL1, GL2, . . . , GLn is disposed in a second direction intersecting with the first direction, and a plurality of pixels P is disposed in a matrix form. Each of the plurality of pixels corresponds to a display element that emits light in the display panel 110.

If a specific gate line GL is opened, the data driver 120 converts image data Data' received from the controller 140 into a data voltage Vdata of an analog form and supplies the data voltage Vdata to the data lines DL1, DL2, DL3, . . . , DLm to drive the data lines DL1, DL2, DL3, . . . , DLm. The data driver 120 will be described in detail with reference to FIG. 2.

The gate driver 130 sequentially drives the gate lines GL1, GL2, . . . , GLn by sequentially supplying an ON voltage or OFF voltage gate signal to the gate lines GL1, GL2, . . . , GLn under the control of the controller 140. The gate driver 130 may be located on only one side or both sides of the display panel 110 depending on a driving method.

Further, the gate driver 130 may include a plurality of gate driver integrated circuits, and the plurality of gate driver integrated circuits may be connected to a bonding pad of the display panel 110 through a tape automated bonding (TAB) method or a chip on glass (COG) method, or implemented in a gate in panel (GIP) type and directly disposed in the display panel 110, or integrated and disposed in the display panel 100 if necessary.

Each of the plurality of gate driver integrated circuits may include a shift register, a level shifter, etc.

The controller 140 supplies control signals to the data driver 120 and the gate driver 130 to control the data driver 120 and the gate driver 130.

The controller 140 starts scanning according to a timing realized in each frame, converts image data Data input from a host system into a data signal format used in the data driver 120, outputs converted image data Data', and controls data driving at an appropriate time according to the scanning.

The controller 140 receives timing signals, such as a vertical synchronization signal Vsync, a horizontal synchronization signal Hsync, an input data enable signal, a clock signal, etc., generates various control signals, and outputs the control signals to the data driver 120 and the gate driver 130 in order to control the data driver 120 and the gate driver 130, in addition to converting the image data Data input from the host system into a data signal format used in the data driver 120 and outputting the converted image data Data'.

For example, the controller 140 outputs gate control signals (GCSs) including a gate start pulse (GSP), a gate shift clock (GSC), a gate output enable (GOE) signal, etc. in order to control the gate driver 130.

The controller 140 outputs data control signals (DCSs) including a source start pulse (SSP), a source sampling clock (SSC), a source output enable (SOE) signal, etc. in order to control the data driver 120.

With reference to FIG. 1, the display device 100 may further include a power controller 150 configured to supply various voltages or currents to the display panel 110, the data driver 120, and the gate driver 130 or control various voltages or currents to be supplied thereto. The power controller 150 may also be referred to as a power management integrated circuit (PMIC).

The display device 100 includes a plurality of common gate lines CGL1, CGL2, . . . , CGLn that supplies a common gate signal to the plurality of pixels, a common gate link line 160 connected in common to the plurality of common gate lines CGL1, CGL2, . . . , CGLn, a plurality of initialization voltage lines VIL1,VIL2,VIL3, . . . , VILm that supplies an initialization voltage Vini to the plurality of pixels, and an initialization voltage link line 170 connected in common to the plurality of initialization voltage lines VIL1,VIL2, VIL3, . . . , VILm. The common gate signal is supplied to each pixel through the plurality of common gate lines CGL1, CGL2, . . . , CGLn and the common gate link line 160 and the initialization voltage Vini is supplied to each pixel through the plurality of initialization voltage lines VIL1, VIL2,VIL3, . . . , VILm and the initialization voltage link line 170, which will be described later with reference to FIG. 3 through FIG. 8.

Figure 2:
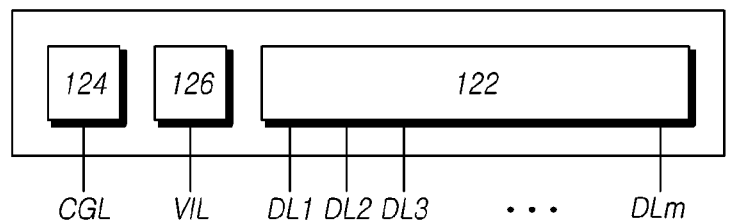
FIG. 2 is a configuration view of the data driver illustrated in FIG. 1.

FIG. 2 is a configuration view of the data driver illustrated in FIG. 1. With reference to FIG. 2, the data driver 120 may include a plurality of source driver integrated circuits, and the plurality of source driver integrated circuits may be connected to a bonding pad of the display panel 110 through a tape automated bonding (TAB) method or a chip on glass (COG) method or may be directly disposed on the display panel 110, or may be integrated and disposed in the display panel 110 if necessary.

The plurality of source driver integrated circuits may be implemented in a chip on film (COF) type. In each of the plurality of source driver integrated circuits, one end is bonded to at least one source printed circuit board and the other end is bonded to the display panel 110.

The data driver 120 may include a data unit 122, a common gate signal supply unit 124, and an initialization voltage supply unit 126.

The data unit 122 is connected to the data lines DL1, DL2, DL3, . . . , DLm and supplies a data voltage to the pixels through the data lines DL1, DL2, DL3, . . . , DLm. The data unit 122 includes a shift register unit, a latch unit, a gamma voltage generation unit, a digital-analog converter (hereinafter, abbreviated to DA converter), and an output circuit unit.

The common gate signal supply unit 124 is connected to a common gate link line for output (CGL) 160 and supplies a common gate signal CGS to the plurality of pixels through the plurality of common gate lines CGL1, CGL2, . . . , CGLn and the common gate link line 160.

Figure 10:
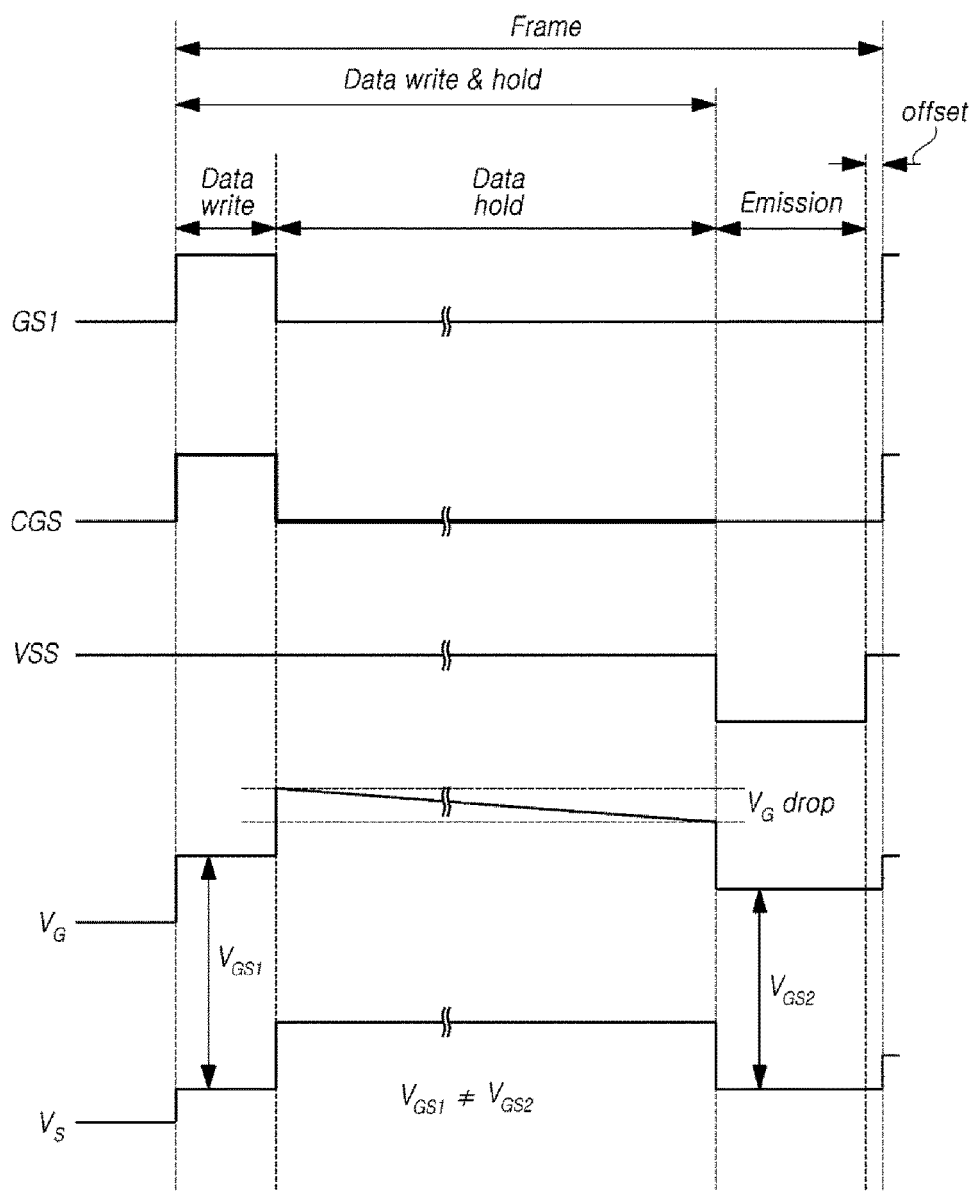
FIG. 10 illustrates signal waveforms in a driving circuit of a single pixel during one frame period in the display device illustrated in FIG. 1 according to another example embodiment.

As will be described later, common gate signals CGS for all of the pixels are unified. Thus, as illustrated in FIG. 10, separate gate signals are not sequentially driven but a single common gate signal is applied, and, thus, a separate gate integrated circuit for generating gate signals is not needed. Therefore, because the gate driver 130 does not need a separate gate integrated circuit for generating additional gate signals, the area of the gate driver 130 can be reduced so as to achieve a narrow bezel.

The initialization voltage supply unit 126 is connected to an initialization voltage link line for output (VIL) 170 and supplies an initialization voltage Vini to the plurality of pixels through the plurality of initialization voltage lines VIL1, VIL2, VIL3, . . . , VILm and the initialization voltage link line 170.

Figure 3:
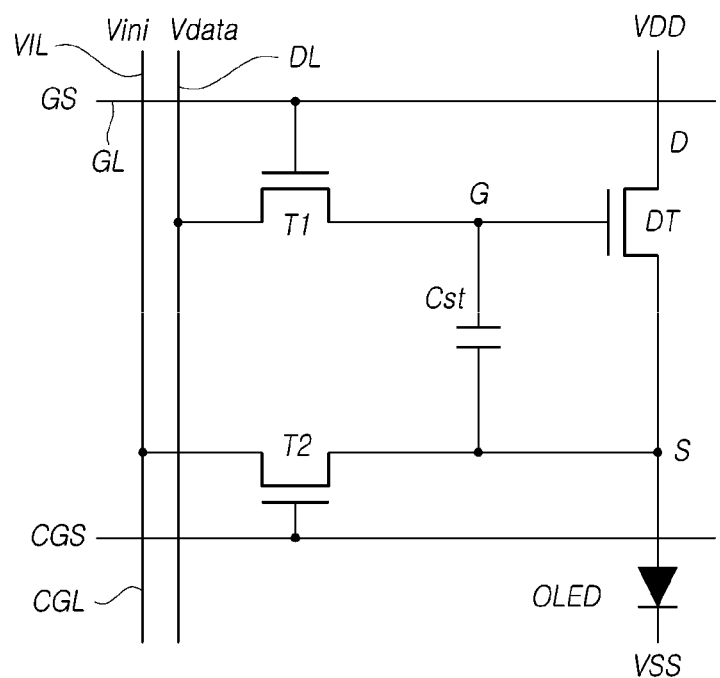
FIG. 3 illustrates an example equivalent circuit diagram of a pixel disposed at an intersection between an Xth data line and a Yth gate line in the display device illustrated in FIG. 1.

FIG. 3 illustrates an example equivalent circuit diagram of a pixel disposed at an intersection between an Xth data line and a Yth gate line in the display device illustrated in FIG. 1.

With reference to FIG. 3, each pixel of the display device 100 may include an organic light emitting diode OLED and a driving circuit configured to drive the organic light emitting diode OLED. The driving circuit includes a driving transistor DT configured to drive the organic light emitting diode OLED by supplying a current to the organic light emitting diode OLED.

A first node of the driving transistor DT is a gate node G and is applied with a voltage V1. A second node of the driving transistor DT is one of a source node or a drain node, e.g., a source node S, and is applied with a voltage V2. A third node of the driving transistor DT is the other one of a drain node or a source node, e.g., a drain node D, and is applied with a driving voltage VDD. Herein, the voltage V1 may be a data voltage Vdata corresponding to a pixel. The voltage V2 may be, for example, an initialization voltage Vini.

The driving circuit may include a capacitor, e.g., a storage capacitor Cst, connected between the first node G and the second node S of the driving transistor DT. The capacitor Cst maintains a constant voltage during one frame period.

In each pixel, in addition to the driving transistor DT and the capacitor Cst, the driving circuit configured to drive the organic light emitting diode OLED may further include one or more additional transistors and one or more additional capacitors.

With reference to FIG. 3, the organic light emitting diode OLED includes a first electrode and a second electrode. An organic layer may be sandwiched between the first electrode and the second electrode. The first electrode of the organic light emitting diode OLED is connected to the driving transistor DT. The second electrode of the organic light emitting diode OLED is connected to a base voltage VSS. The base voltage VSS may be changed to a low voltage and a high voltage under the control of the controller 140 and/or the power controller 150.

The driving transistor DT includes the first node G to be applied with the data voltage Vdata, the second node S connected to the first electrode of the organic light emitting diode OLED, and the third node D connected to the driving voltage VDD.

Each pixel of the display device 100 includes a first transistor T1 electrically connected between the data line DL that supplies the data voltage Vdata and the first node G of the driving transistor DT, and a second transistor T2 electrically connected between the initialization voltage line VIL that supplies the initialization voltage Vini and the second node S of the driving transistor DT.

The first transistor T1 is turned on and off or switched by a gate signal GS to be applied through the gate line GL. When the first transistor T1 is turned on in response to the gate signal GS, the first transistor T1 applies the data voltage Vdata to the first node G node of the driving transistor DT.

The second transistor T2 is turned on and off or switched by a common gate signal CGS to be applied through the common gate line CGL. When the second transistor T2 is turned on in response to the common gate signal CGS, the second transistor T2 applies the initialization voltage Vini to the second node S of the driving transistor DT.

The capacitor Cst is electrically connected between the first node G and the second node S of the driving transistor DT. The capacitor Cst maintains data information Vgs, which is a difference between the data voltage Vdata ($=V_G$) applied to the first node G of the driving transistor DT and the initialization voltage Vini ($=V_S$) applied to the second node S during one frame period.

Therefore, there may be no effect of parasitic capacitors connected to the second node S. Therefore, the size of the capacitor Cst can be reduced by that much, and, thus, an aperture ratio can be increased. Also, a load of the capacitor Cst for all of the pixels can be reduced, which may be advantageous for high-speed operation.

Figure 4:
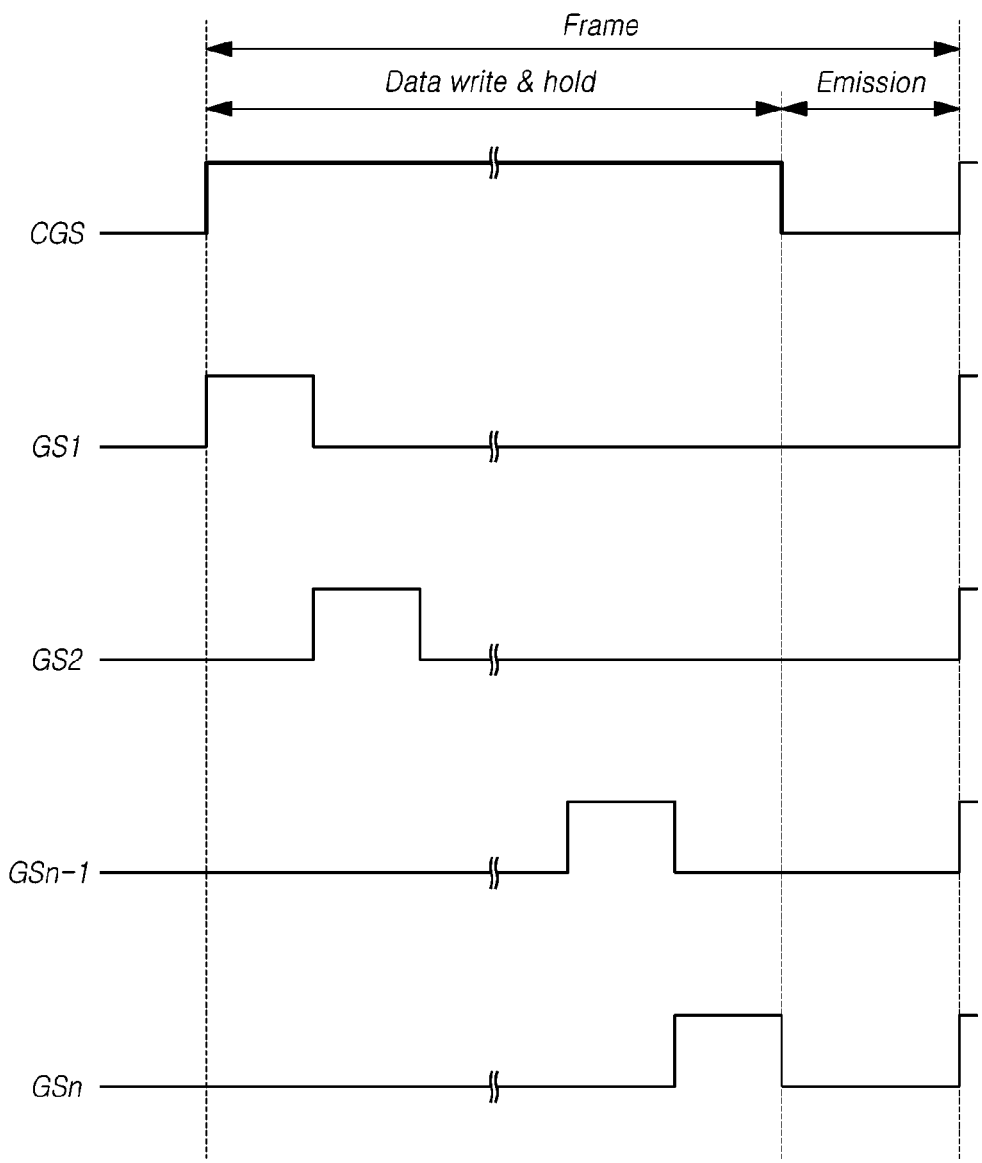
FIG. 4 illustrates signal waveforms of a common gate signal and gate signals on gate lines during one frame period in the display device illustrated in FIG. 1.
Figure 5:
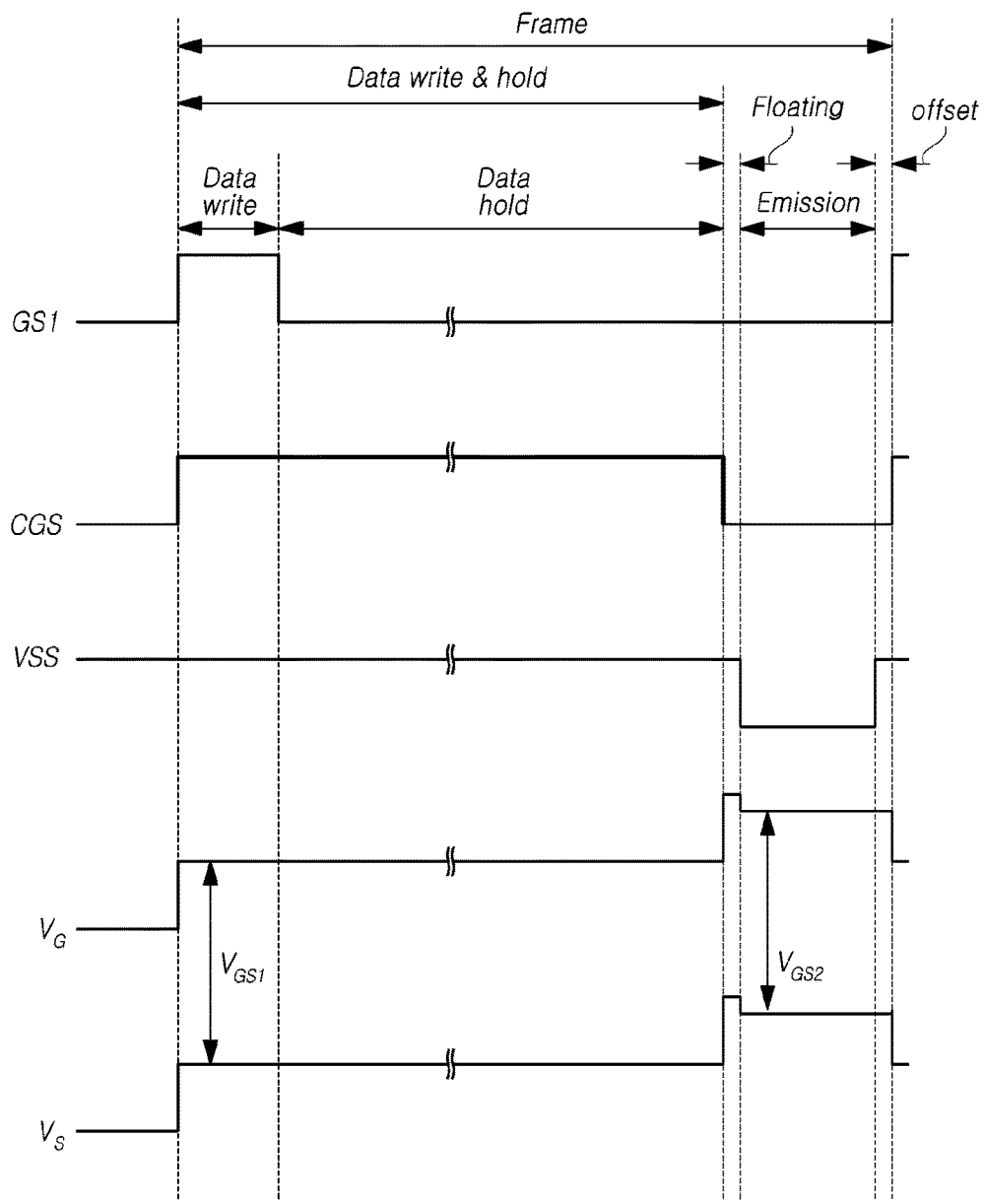
FIG. 5 illustrates signal waveforms in a driving circuit of a single pixel during one frame period in the display device illustrated in FIG. 1.

FIG. 4 illustrates signal waveforms of a common gate signal and gate signals on gate lines during one frame period in the display device illustrated in FIG. 1. FIG. 5 illustrates signal waveforms in a driving circuit of a single pixel during one frame period in the display device illustrated in FIG. 1.

With reference to FIG. 4 and FIG. 5, one frame period includes a data write & hold period, Data write & hold, in which data are written in each pixel and maintained for a predetermined period of time, and an emission period Emission, in which light is actually emitted according to the maintained data.

The data write & hold period Data write & hold may be divided into a data write period, Data write, in which data is written in each pixel, and a data hold period, Data hold, in which the written data is maintained for a predetermined period of time.

Because gate signals are sequentially applied to the gate lines GL1, GL2, . . . , GLn in sequence, data write periods (Data write) for the respective pixels may be sequentially positioned in the order of the gate lines GL1, GL2, . . . , GLn. As a result, the rest of the data write & hold period (Data write & hold) after the data write period (Data write) for each pixel corresponds to the data hold period (Data hold). Therefore, the length of the data hold period (Data hold) for each pixel may vary.

The first transistor T1 is turned on during the data write period (Data write) in which the data voltage Vdata is applied to the driving transistor DT in a data write & hold period (Data write & hold).

In other words, the gate signal GS applied to a specific pixel maintains a high state during the data write period (Data write) and maintains a low state during the rest of the period. Therefore, when the first transistor T1 is turned on by the gate signal GS during the data write period (Data write), the data voltage Vdata is applied to the first node G of the driving transistor DT.

The second transistor T2 is turned on during the data write period and the data hold period (Data write & hold). When the second transistor T2 is turned on by the common gate signal CGS during the data write period and the data hold period (Data write & hold), the initialization voltage Vini is applied to the second node S of the driving transistor DT.

As a result, the first transistor T1 and the second transistor T2 are not turned off at the same time in each pixel, but the second transistor T2 maintains an on state during the data hold period (Data hold). Therefore, the initialization voltage Vini is continuously applied to the second node S node of the driving transistor DT through the second transistor T2.

With reference to FIG. 5, the base voltage VSS connected to the second electrode of the organic light emitting diode OLED maintains a low state during the emission period Emission and maintains a high state during the other periods. Because the base voltage VSS maintains a low state during the emission period Emission, the driving transistor DT outputs a current corresponding to data information $V_{GS1}$ (=$V_{GS2}$) maintained in the capacitor Cst and then supplies the current to the organic light emitting diode OLED.

Meanwhile, one frame period may include a floating period Floating between the data write & hold period (Data write & hold) and the emission period Emission. Herein, the floating period Floating may be shorter in length than the data write period (Data write) in order to reduce or minimize a frame time. The second transistor T2 is in an off state during the floating period Floating and the base voltage VSS maintains a high state.

Thus, even if the first node G of the driving transistor DT is floated, the voltage $V_{GS1}$ (=$V_{GS2}$) of the first node G of the driving transistor DT is maintained through the initialization voltage Vini of the second node S of the driving transistor DT and the capacitor Cst.

Figure 6:
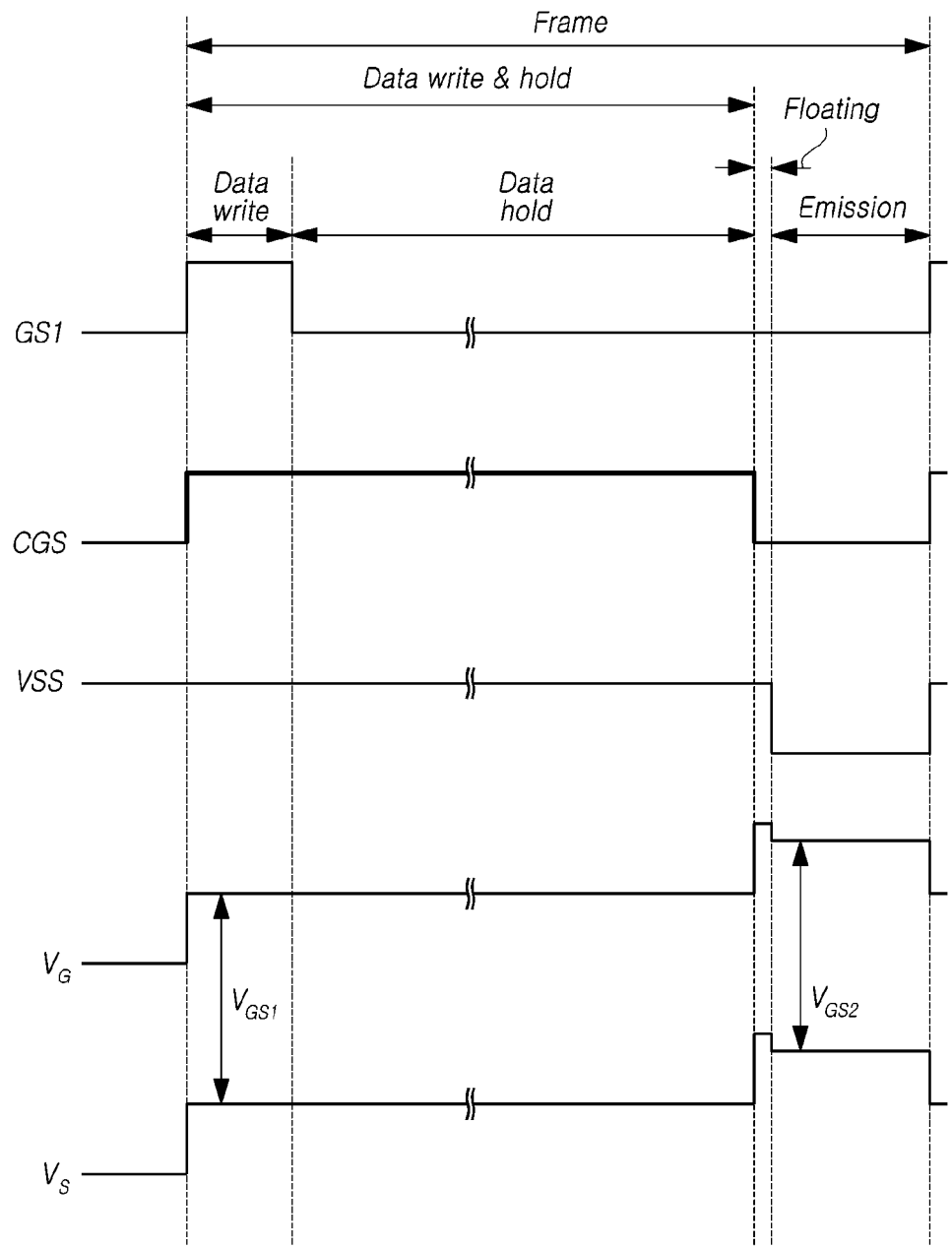
FIG. 6 illustrates another example of signal waveforms in the driving circuit of the single pixel during one frame period in the display device illustrated in FIG. 5.

Meanwhile, one frame period may include an offset period offset between the emission period Emission and a data write & hold period (Data write & hold) for a subsequent frame period. The offset period may be provided to suppress the generation of an error caused by time offset with a predetermined interval between one frame period and a subsequent frame period. However, one frame period may not include the offset period offset, as shown in FIG. 6.

The first transistor T1 and the second transistor T2 may be in an off state during the offset period offset and the base voltage VSS may maintain a high state.

Figure 7:
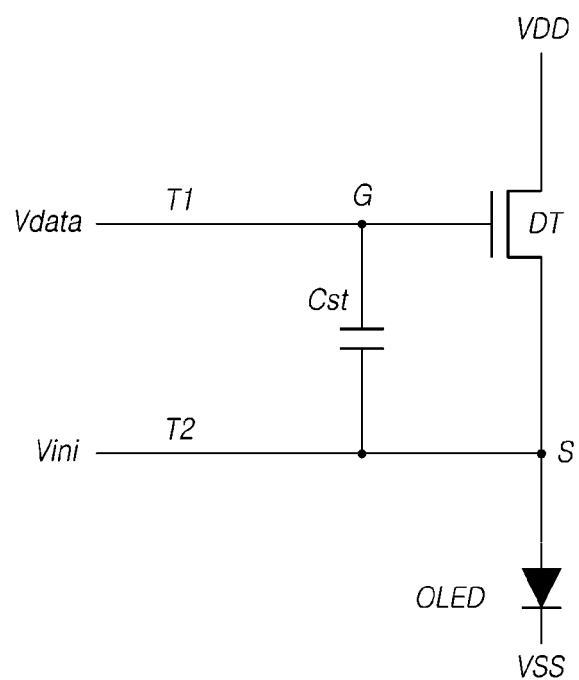
FIG. 7 through FIG. 9 illustrate equivalent circuit diagrams of one of the respective pixels during one frame period in the display device illustrated in FIG. 1.
Figure 8:
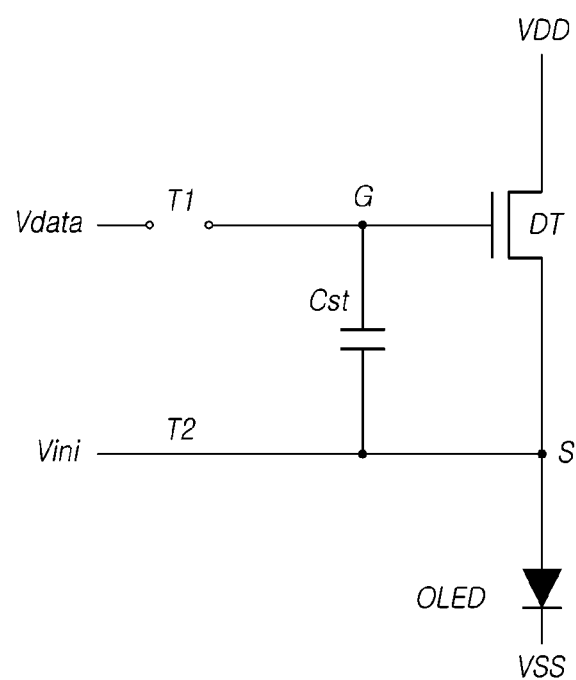
Figure 9:
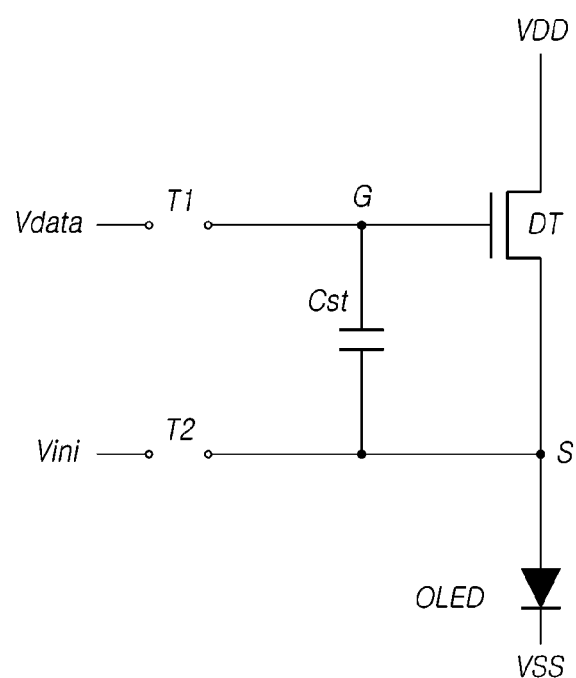

FIG. 7 through FIG. 9 illustrate equivalent circuit diagrams of a respective pixel during one frame period in the display device illustrated in FIG. 1.

As illustrated in FIG. 5 and FIG. 7, in a pixel structure of the display device, during the data write period Data write, the data voltage Vdata (=$V_G$) and the initialization voltage Vini (=$V_S$) are applied to the first node G and the second node S of the driving transistor DT at the same time so as to write the data information $V_{GS}$.

As illustrated in FIG. 5 and FIG. 8, during the data hold period Data hold, the written data information VGS is stored in the capacitor Cst before emission of light. Herein, the stored data information VGS is maintained and the first node G and the second node S of the driving transistor DT are in a floating state during the floating period Floating between the data hold period Data hold and the emission period Emission.

As illustrated in FIG. 5 and FIG. 9, as the base voltage VSS falls to a low state during the emission period Emission, the organic light emitting diode OLED emits light according to the stored data information VGS.

In each pixel, the first transistor T1 and the second transistor T2 are not turned off at the same time, but the second transistor T2 maintains an on state during the data hold period Data hold (see FIG. 8). Therefore, a first node voltage $V_G$ of the first node G of the driving transistor DT does not fall but is maintained during the floating period Floating of the first node G and the second node S of the driving transistor DT. As a result, the data information VGS does not fall but is maintained.

FIG. 10 illustrates signal waveforms in a driving circuit of a single pixel during one frame period in the display device illustrated in FIG. 1 according to another example embodiment.

With reference to FIG. 10, in a pixel structure of the display device, during the data write period Data write, a voltage is applied to the first node G and the second node S of the driving transistor DT at the same time so as to write the data information VGS. The first transistor T1 and the second transistor T2 are turned on and then turned off at the same time during the data write period Data write.

The gate driver 130 may need to further include a gate integrated circuit configured to apply different gate signal CGS to each pixel, because the second transistors T2 of different pixels are individually turned on and off, e.g., switching. Thus, the size of the gate driver 130 may be increased. Therefore, it may be necessary to reduce the area of the gate driver 130 in order to achieve a narrow bezel.

Then, during the data hold period Data hold, the written data information VGS may be stored in the capacitor Cst before emission of light.

During the data hold period Data hold, the first node G and the second node S of the driving transistor DT are in a floating state.

As the base voltage VSS falls during the emission period Emission, the organic light emitting diode OLED emits light according to the stored data information VGS.

As illustrated in FIG. 10, the data hold period Data hold may be relatively longer than the data write period Data write. In this case, the first transistor T1 and the second transistor T2 may be turned off at the same time. Thus, while the first node G and the second node S of the driving transistor DT are in a floating state, the first node voltage VG of the first node G of the driving transistor DT may drop ($V_{GS}$drop, $V_{GS1}$>$V_{GS2}$) for various reasons such as a leakage current.

Because the first node G and the second node S of the driving transistor DT are in a floating state during the data hold period Data hold, the data information $V_{GS}$ needs to be maintained only by the capacitor Cst, and the capacitor Cst is affected by parasitic capacitors, the size of the capacitor Cst may not be able to be reduced. As a result, a load of the capacitor Cst for each pixel may need to be reduced for high-speed operation.

Because the length of the data hold period Data hold for each pixel may vary, there may be a difference in gray scale of the organic light emitting diode OLED depending on a position within the display device caused by a difference in length of the data hold period Data hold.

With reference to FIG. 4 through FIG. 9, the display device according to an example embodiment described above may suppress a difference in gray scale of the organic light emitting diode OLED depending on a position within the display device caused by a difference in length of the data hold period Data hold.

Meanwhile, in the display device according to an example embodiment described above, the first transistor T1 and the second transistor T2 are not turned off at the same time in each pixel, but the second transistor T2 maintains an on state during the data hold period Data hold.

In the display device described above according to an example embodiment, the capacitor Cst and the initialization voltage Vini of the second node S of the driving transistor DT function to maintain the data information VGS at the same time. Therefore, as described above with reference to FIG. 10, the size of the capacitor Cst may be reduced as compared with the case where the first transistor T1 and the second transistor T2 are turned off at the same time.

The display device described above according to an example embodiment may be advantageous for high-speed operation by reducing a load of the capacitor Cst for all of the pixels.

The display device described above according to an example embodiment may suppress a difference in gray scale of the organic light emitting diode OLED depending on a position within the display device despite a difference in length of the data hold period Data hold. That is, the data information VGS of the driving transistor DT in which data are first written may not be reduced during the data hold period Data hold. Therefore, the pixels for all positions in the display device may maintain the same data information $V_{GS}$.

The example embodiments have been described above with reference to the accompanying drawings, but the present disclosure is not limited thereto. For example, it has been described that—when a high voltage or high signal is applied to the gates of the driving transistor DT, the first transistor T1, and the second transistor T2—the driving transistor DT, the first transistor T1, and the second transistor T2 are turned on, and when a low voltage or low signal is applied thereto, the driving transistor DT, the first transistor T1, and the second transistor T2 are turned off. However—when a low voltage or low signal is applied to the gates of the driving transistor DT, the first transistor T1, and the second transistor T2—the driving transistor DT, the first transistor T1, and the second transistor T2 may be turned on, and when a high voltage or high signal is applied thereto, the driving transistor DT, the first transistor T1, and the second transistor T2 may be turned off.

According to the present example embodiments described above, it may be possible to provide a display element and a display device in which an aperture ratio can be increased and a high-speed operation can be performed.

Also, according to the present example embodiments, it may be possible to provide a display element and a display device in which the area of a driver can be reduced so as to achieve a narrow bezel.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display element, comprising:
   an organic light emitting diode including a first electrode and a second electrode;
   a driving transistor including a first node to be supplied with a data voltage, a second node connected to the first electrode of the organic light emitting diode, and a third node electrically connected to a driving voltage line;
   a first transistor electrically connected between a data line configured to supply the data voltage and the first node of the driving transistor;
   a second transistor electrically connected between an initialization voltage line configured to supply an initialization voltage and the second node of the driving transistor; and
   a capacitor electrically connected between the first node and the second node of the driving transistor,
   wherein a length of a period in which the first transistor is turned on and a length of a period in which the second transistor is turned on overlap and are different from each other,
   the second electrode of the organic light emitting diode is connected to a base voltage, and
   the base voltage maintains a low state during an emission period and maintains a high state during other periods of one frame period.

2. The display element according to claim 1, wherein:
   the one frame period includes a data write and hold period and the emission period, the data write and hold period includes a data write period and a data hold period,
   the first transistor is turned on during the data write period in which the data voltage is supplied to the corresponding driving transistor in the data write and hold period, and the second transistor is turned on during the data write period and the data hold period.

3. The display element according to claim 2, wherein:
   the one frame period further includes a floating period between the data write and hold period and the emission period, and
   the second transistor is in an off state and the base voltage maintains a high state during the floating period.

4. The display element according to claim 3, wherein the floating period is shorter than the data write period.

5. The display element according to claim 2, wherein:
   the one frame period further includes an offset period between the emission period and the data write and hold period of a subsequent frame period, and
   the first transistor and the second transistor are in an off state and the base voltage maintains a high state during the offset period.

6. A display device, comprising:
   a plurality of pixels at intersections of a plurality of data lines and a plurality of gate lines;
   a plurality of common gate lines to supply a common gate signal to the plurality of pixels;
   a common gate link line connected in common to the plurality of common gate lines;
   a plurality of initialization voltage lines to supply an initialization voltage to the plurality of pixels; and an initialization voltage link line connected in common to the plurality of initialization voltage lines, wherein each of the plurality of pixels includes:

an organic light emitting diode including a first electrode and a second electrode;

a driving transistor including a first node to be supplied with a data voltage from one of the data lines, a second node connected to the first electrode of the organic light emitting diode, and a third node electrically connected to a driving voltage line;

a first transistor electrically connected between the one of the data lines and the first node of the driving transistor and switched by a gate signal supplied through one of the gate lines;

a second transistor electrically connected between one of the initialization voltage lines and the second node of the driving transistor and switched by the common gate signal supplied through one of the common gate lines; and a capacitor electrically connected between the first node and the second node of the driving transistor, wherein a length of a period in which the first transistor is turned on and a length of a period in which the second transistor is turned on overlap and are different from each other, the second electrode of the organic light emitting diode is connected to a base voltage, and the base voltage maintains a low state during an emission period and maintains a high state during other periods of one frame period.

7. The display device according to claim 6, further comprising:

a data driver to supply the data voltage to the pixels through the data lines and supply the common gate signal to the pixels through the common gate link line; and a gate driver to supply the gate signal to the pixels through the gate lines.

8. The display device according to claim 7, wherein the data driver supplies the initialization voltage through the initialization voltage link line.

9. The display device according to claim 8, wherein:

the one frame period includes a data write and hold period and the emission period, the data write and hold period includes a data write period and a data hold period, the first transistor is turned on during a data write period in which the data voltage is supplied to the corresponding driving transistor in the data write and hold period, and the second transistor is turned on during the data write period and a data hold period.

10. The display device according to claim 9, wherein:

the one frame period further includes a floating period between the data write and hold period and the emission period, and the second transistor is in an off state and the base voltage maintains a high state during the floating period.

11. The display device according to claim 10, wherein the floating period is shorter than the data write period.

12. The display device according to claim 10, wherein:

the one frame period further includes an offset period between the emission period and the data write and hold period of a subsequent frame period, and the first transistor and the second transistor are in an off state and the base voltage maintains a high state during the offset period.

13. A display device including a display element and a data driver, comprising:

the display element including:

an organic light emitting diode including a first electrode and a second electrode;

a driving transistor including a first node to be supplied with a data voltage, a second node connected to the first electrode of the organic light emitting diode, and a third node electrically connected to a driving voltage line;

a first transistor electrically connected between a data line configured to supply the data voltage and the first node of the driving transistor;

a second transistor electrically connected between an initialization voltage line configured to supply an initialization voltage and the second node of the driving transistor; and a capacitor electrically connected between the first node and the second node of the driving transistor; and the data driver including:

a data circuit connected to the data line and configured to supply the data voltage to the display element through the data line;

a common gate signal supply circuit connected to a common gate link line and configured to supply a common gate signal to the display element through the common gate link line; and an initialization voltage supply circuit connected to an initialization voltage link line and configured to supply an initialization voltage to the display element through the initialization voltage link line, wherein a length of a period in which the data voltage is supplied to the display element and a length of a period in which the common gate signal is supplied to the display element overlap and are different from each other, a length of a period in which the first transistor is turned on and a length of a period in which the second transistor is turned on overlap and are different from each other, the second electrode of the organic light emitting diode is connected to a base voltage, and the base voltage maintains a low state during an emission period and maintains a high state during other periods of one frame period.

14. The display device according to claim 13, wherein the one frame period includes a data write and hold period and the emission period, and the common gate signal supply circuit supplies the common gate signal during the data write and hold period.

* * * * *